(12) United States Patent
Lee

(10) Patent No.: US 6,451,630 B2
(45) Date of Patent: Sep. 17, 2002

(54) METHOD FOR MANUFACTURING A THIN-FILM TRANSISTOR

(75) Inventor: Jeong-no Lee, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/731,693

(22) Filed: Dec. 8, 2000

(30) Foreign Application Priority Data

Dec. 8, 1999 (KR) ............................................. 99-55686

(51) Int. Cl.[7] .......................... H01L 21/00; H01L 21/84
(52) U.S. Cl. ...................... 438/144; 438/147; 438/149; 438/163; 438/164; 438/30; 257/72; 257/344; 257/408
(58) Field of Search ................................. 438/147, 149, 438/153, 154, 163, 164, 161, 30; 257/72, 344, 350, 351, 408

(56) References Cited

U.S. PATENT DOCUMENTS 5,980,763 A * 11/1999 Young .......................... 216/23

* cited by examiner

Primary Examiner—Wael Fahmy
Assistant Examiner—Hsien-Ming Lee
(74) Attorney, Agent, or Firm—McGuireWoods LLP; Hae-Chan Park

(57) ABSTRACT

A method for manufacturing a thin film transistor is disclosed. Afterforming a channel region on a surface of a substrate, an insulating layer is deposited on the surface of the substrate to cover the channel region. The insulating layer is pataterned such that a portion of the channel region is exposed. Then, a silicon layer and a metal layer are sequentially deposited on the insulating layer. The silicon and metal layers are etched to define source, drain and gate electrode sections. After doping positive ions on a portion corresponding to a MOS circuit portion, an intermediate insulating layer is deposited on the metal layer while covering the source, drain and gate electrode sections. The intermediate insulating layer is patterned to form a plurality of contact holes. An electrode material is deposited on the intermediate insulating layer and patterned to define a pixel electrode section and a wire section.

5 Claims, 4 Drawing Sheets

METHOD FOR MANUFACTURING A THIN-FILM TRANSISTOR

BACKGROUND OF THE INVENTION

1. Field of the Invention

The present invention relates to a thin-film transistor (TFT) and, more particularly, to a method for manufacturing a TFT that can reduce the number of photolithography processes, that can easily adjust a width of an lightly doped drain region and planarize the film surface.

2. Description of the Related Art

Generally, TFTs are widely used as a switching element for turning On/Off pixels of a flat panel display such as an active matrix liquid crystal display, because they can contain CMOS on the substrate. To use the TFT as a switching element, the TFT should be able to withstand a high voltage and to provide a high ratio of On currents to Off current.

As is well known, such a TFT is manufactured through a number of photolithography processes, each comprising a plurality of steps such as a photoresist step, a light-exposing step, and an etching step. As the number of processes increases, the overall productivity is lowered and the quality of the TFT is deteriorated.

In addition, in the conventional TFT, since source and drain electrodes and a gate electrode are formed in a different step, it is difficult to adjust the width of an lightly doped drain (LDD) region, while increasing the number of layers that are stacked and the number of photolithography processes. The more number of layers stacked makes a surface of the TFT uneven, costing the reflecting efficiency in a reflective-type LCD.

SUMMARY OF THE INVENTION

Therefore, the present invention has been made in an effort to solve the above described problems.

It is an objective of the present invention to provide a method for manufacturing a TFT that can reduce the number of photolithography processes, that can easily adjust the width of an LDD region and planarize the TFT surface.

To achieve the above objective, the present invention provides a method for manufacturing a thin film transistor comprising the steps of forming a channel region on a surface of a substrate, depositing an insulating layer on the surface of the substrate while covering the channel region and patterning the insulating layer such that a portion of the channel region is exposed, depositing a silicon layer on the insulating layer, depositing a metal layer on the silicon layer and etching the silicon and metal layers to define source, drain and gate electrode sections, doping positive ions on a portion corresponding to a MOS circuit portion, depositing an intermediate insulating layer on the metal layer while covering the source, drain and gate electrode sections and patterning the intermediate insulating layer to form a plurality of contact holes, and depositing an electrode material on the intermediate insulating layer and patterning the electrode material to define a pixel electrode section and a wire section.

The method may further comprise the step of doping negative ions to define an LDD region at an exposed portion of the channel region before doping the positive ions.

The step of doping the positive ions comprises the step of doping n+ ions of on an NMOS circuit section. Alternatively, the step of doping the positive ions comprises the step of doping p+ ions on a PMOS circuit section.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF PREFERRED EMBODIMENTS

Reference will now be made in detail to the present preferred embodiment of the invention, an example of which is illustrated in the accompanying drawings. Wherever possible, the same reference numbers will be used throughout the drawings to refer to the same or like parts.

In the following embodiment, a CMOS TFT includes a pixel section, a wire section, a PMOS circuit section, and an NMOS circuit section.

Figure 1A:
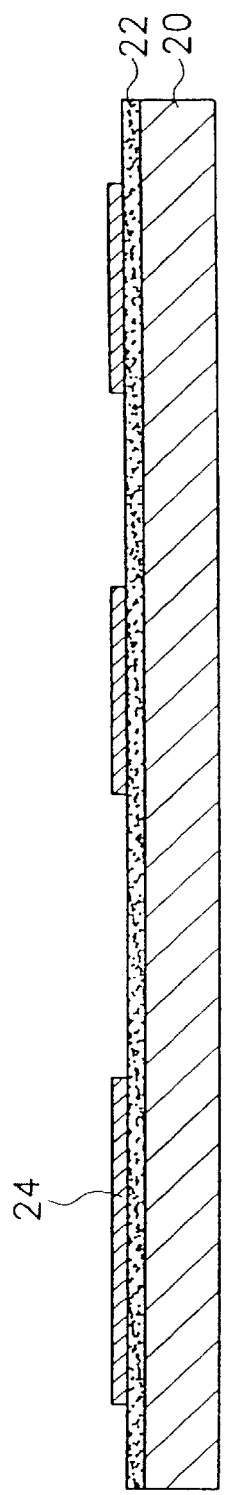
FIGS. 1a through 1g illustrate cross-sectional views of a portion of a TFT as it undergoes sequential processing steps according to a preferred embodiment of the present invention.

FIGS. 1a to 1g are cross-sectional views of a portion of a CMOS TFT as it undergoes sequential processing steps. Referring first to FIG. 1a, a buffer layer 22 is first deposited on a substrate 20, then a pattern of a channel region 24 is formed on the buffer layer 22. To form the pattern of the channel region 24, an active layer is first deposited on the buffer layer 22 using an amorphous silicon, then crystallized by an eximer laser, and patterned through a photolithography process. The buffer layer 22 may be omitted.

Figure 1B:
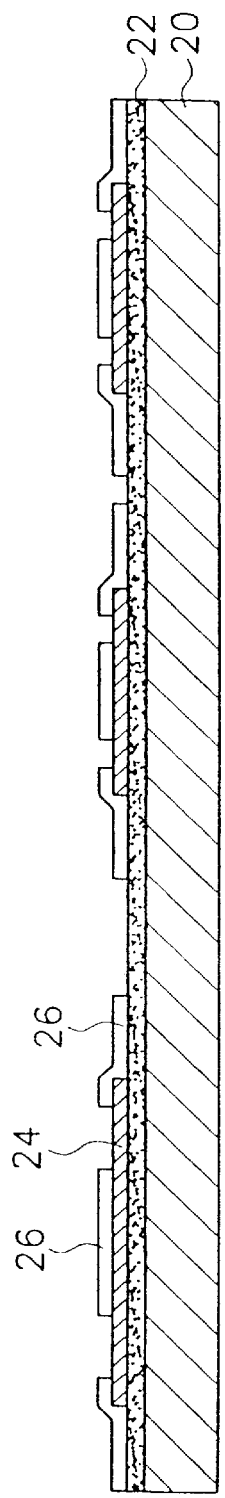
Figure 1C:
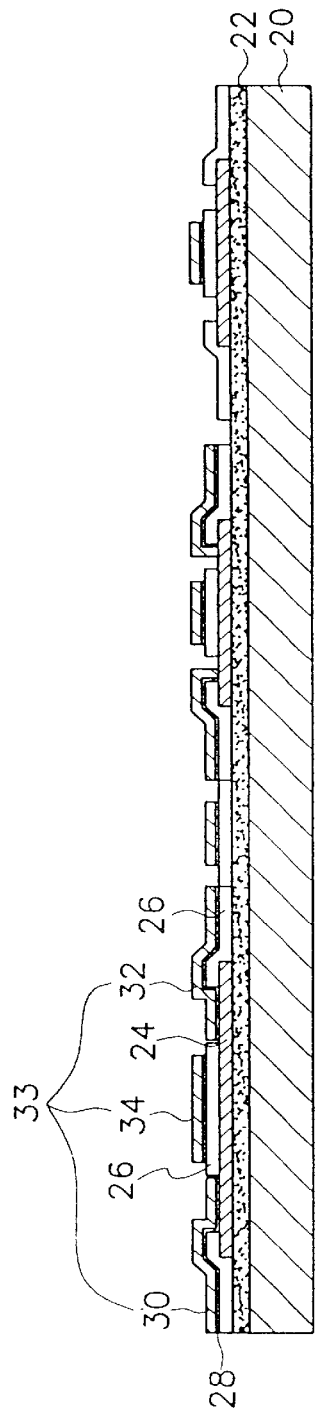

After forming the channel region 24, an insulating layer is deposited on the buffer layer 22 while covering the channel region 24, then patterned such that the channel region 24 is exposed except for its edges and middle portion as shown in FIG. 1b.

Next, an n+ or p+ silicon layer 28 is deposited on the insulating layer 26 and the channel region 24, and a metal layer 33 is deposited on the n+ or p+ silicon layer 28. Then, the silicon and metal layers 28 and 33 are simultaneously etched to define drain, source and gate electrode regions 30, 32 and 34. Here, the silicon layer 28 is used for ohmic contacts between the channel region 24 and each of the drain and source electrode regions 30 and 32.

At this point, the silicon layer 28 formed under the gate electrode 34 of an NMOS circuit section is the n+ silicon layer, and the silicon layer 28 formed under the gate electrode of a PMOS circuit section is the p+ silicon layer.

Next, n− or p− ions are doped on the channel region 24 using the gate electrode region 34 as a mask such that an exposed portion of the channel region 24 become an LDD region.

Figure 1D:
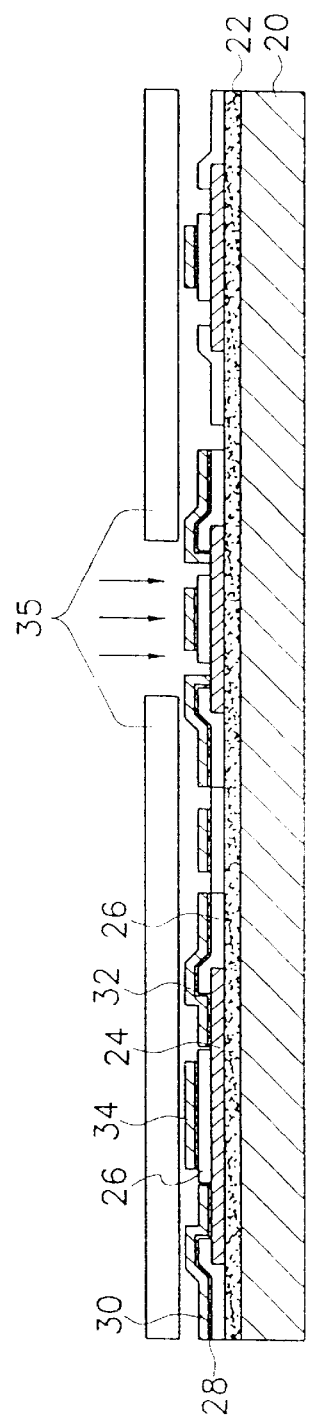
Figure 1E:
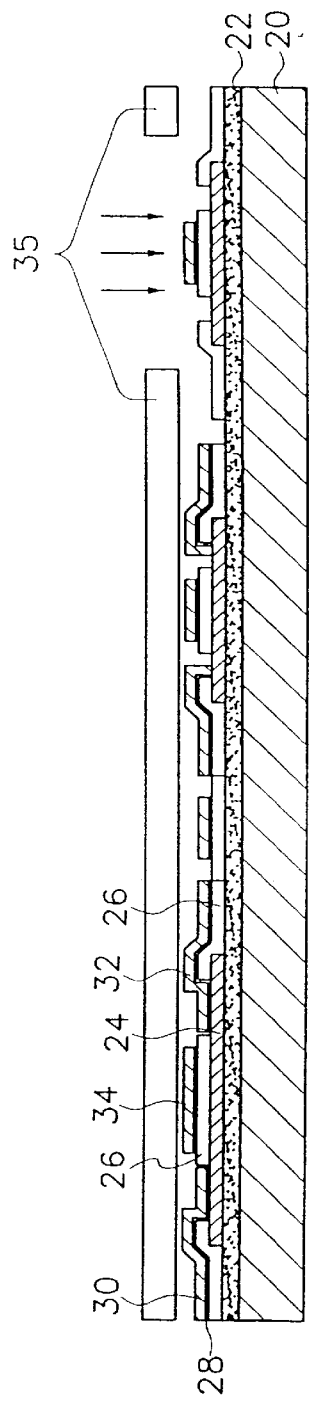
Figure 1F:
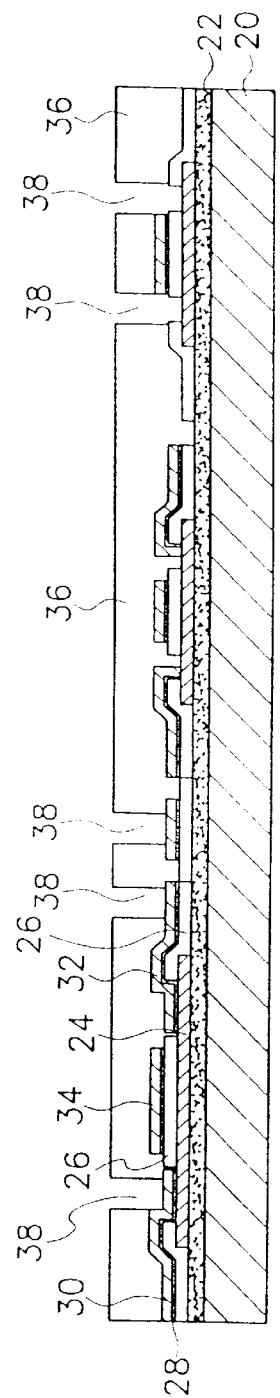
Figure 1G:
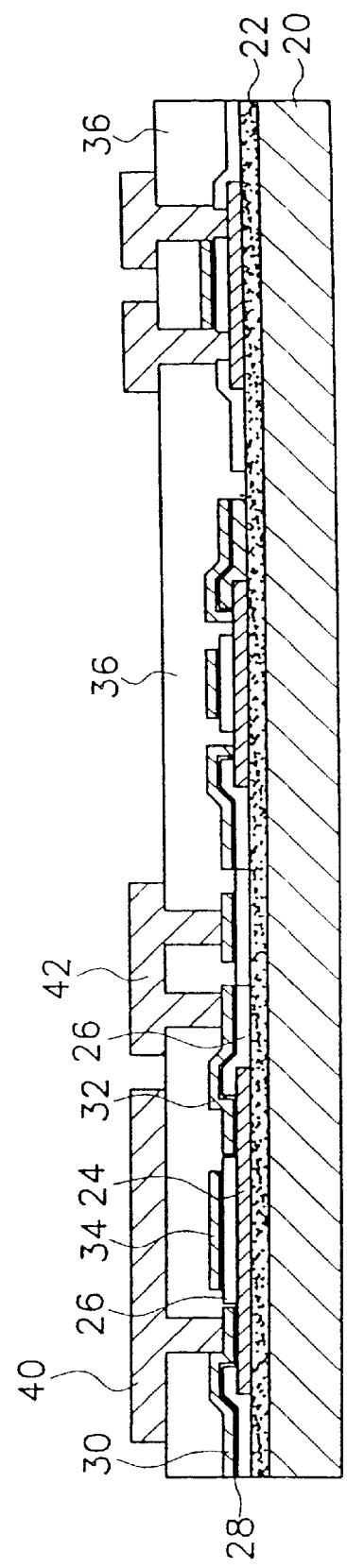

Then, through a photolithography process using a mask 35, as shown in FIG. 1d, n+ ions are doped on a portion corresponding to the NMOS circuit, and as shown in FIG. 1e, p+ ions are doped on a portion of the PMOS circuit. If a TFT is formed having only the NMOS circuits or PMOS circuits, only the corresponding ions are doped.

After the circuits are doped, an intermediate insulating layer 36 is deposited, then patterned such that a plurality of contact holes 38 are formed as Next, an electrode material is deposited on the intermediate insulating layer 36 and patterned using a mask such that a pixel electrode 40 and a wire section 42, which respectively contact the source and drain electrodes 30 and 32, can be defined on the intermediate insulating layer 36.

As described above, since the source and drain electrodes, and the gate electrode are simultaneously formed, the number of photolithography processes for manufacturing the TFT can be reduced, improving productivity and yield.

In addition, since gaps between the source, drain, and gate electrodes can be adjusted on the mask, it is easy to adjust the LDD region and reduce the thickness of the TFT. Furthermore, since a silicon layer is formed under the gate electrode, the characteristics of the gate electrode and the channel region does not become much different, lowering the threshold voltage.

While this invention has been described in connection with what is presently considered to be the most practical and preferred embodiment, it is to be understood that the invention is not limited to the disclosed embodiments, but, on the contrary, is intended to cover various modifications and equivalent in arrangements included within the spirit and scope of the appended claims.

What is claimed is:

1. A method for manufacturing a thin film transistor, comprising the steps of:

forming a channel region on a surface of a substrate;

depositing an insulating layer on the surface of the substrate to cover the channel region;

patterning the insulating layer such that a portion of the channel region is exposed;

depositing a silicon layer on the insulating layer;

depositing a metal layer on the silicon layer;

etching the silicon layer and the metal layer at the same time to define a source electrode, a drain electrode and a gate electrode;

doping positive ions on a portion corresponding to an exposed portion of channel in a MOS circuit;

depositing an intermediate insulating layer on the metal layer to cover the source electrode, the drain electrode and the gate electrode;

patterning the intermediate insulating layer to form a plurality of contact holes at regions where a pixel electrode and a wire are to be formed; and depositing an electrode material on the intermediate insulating layer; and patterning the electrode material to define a pixel electrode section and a wire section.

2. A method of claim 1, further comprising the step of doping negative ions to define an LDD region at exposed portion of the channel region before doping the positive ions.

3. A method of claim 1, wherein the step of doping the positive ions comprises the step of doping n+ ions on an NMOS circuit section.

4. A method of claim 1, wherein the step of doping the positive ions comprises the step of doping p+ ions on a PMOS circuit section.

5. A method of claim 1, wherein the step of doping the positive ions comprises the steps of doping n+ ions on an NMOS circuit section and doping p+ ions on a PMOS circuit section.

* * * * *